(12) United States Patent
Yen

(10) Patent No.: US 9,362,613 B2
(45) Date of Patent: Jun. 7, 2016

(54) BOND WIRE ANTENNA

(71) Applicant: Taiwan Semiconductor Manufacturing Company, Ltd., Hsin-Chu (TW)

(72) Inventor: Hsiao-Tsung Yen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 310 days.

(21) Appl. No.: 13/789,040

(22) Filed: Mar. 7, 2013

(65) Prior Publication Data

US 2014/0253391 A1  Sep. 11, 2014

(51) Int. Cl.
*H01Q 1/36* (2006.01)
*H01P 11/00* (2006.01)
*H01Q 7/00* (2006.01)
*H01Q 9/00* (2006.01)

(52) U.S. Cl.
CPC ............ *H01Q 1/36* (2013.01); *H01P 11/001* (2013.01); *H01Q 7/00* (2013.01); *H01Q 9/00* (2013.01); *Y10T 29/49016* (2015.01)

(58) Field of Classification Search
CPC ............ H01Q 1/36; H01Q 9/00; H01Q 7/00; H01P 11/001; H01T 29/49016
USPC ................................ 343/700 MS, 702; 29/600
See application file for complete search history.

(56) References Cited

U.S. PATENT DOCUMENTS

| | | | |
|---|---|---|---|
| 2006/0028378 A1* | 2/2006 | Gaucher et al. | 343/700 MS |
| 2009/0262023 A1* | 10/2009 | Ying et al. | 343/700 MS |
| 2012/0082194 A1* | 4/2012 | Tam et al. | 375/219 |
| 2013/0266048 A1* | 10/2013 | Chang et al. | 375/219 |
| 2014/0369393 A1* | 12/2014 | Tam et al. | 375/219 |

\* cited by examiner

*Primary Examiner* — Hoanganh Le
(74) *Attorney, Agent, or Firm* — Slater Matsil, LLP

(57) ABSTRACT

An antenna structure includes a substrate having at least one first pad for wire bonding. A chip is mounted on the substrate, and the chip has at least one second pad for wire bonding. At least one bond wire connects the at least one first pad and the at least one second pad. The at least one bond wire is configured to transmit or receive an electromagnetic wave signal in at least one specified frequency for data communication.

22 Claims, 4 Drawing Sheets

BOND WIRE ANTENNA

TECHNICAL FIELD

The present disclosure relates generally to an integrated circuit and more particularly to an antenna.

BACKGROUND

An antenna implemented on an integrated circuit or on a printed circuit board can occupy a relatively large area. Also, the connection to the antenna can influence the antenna performance due to parasitic inductance or capacitance.

BRIEF DESCRIPTION OF THE DRAWINGS

Reference is now made to the following descriptions taken in conjunction with the accompanying drawings, in which.

DETAILED DESCRIPTION

Figure 1:
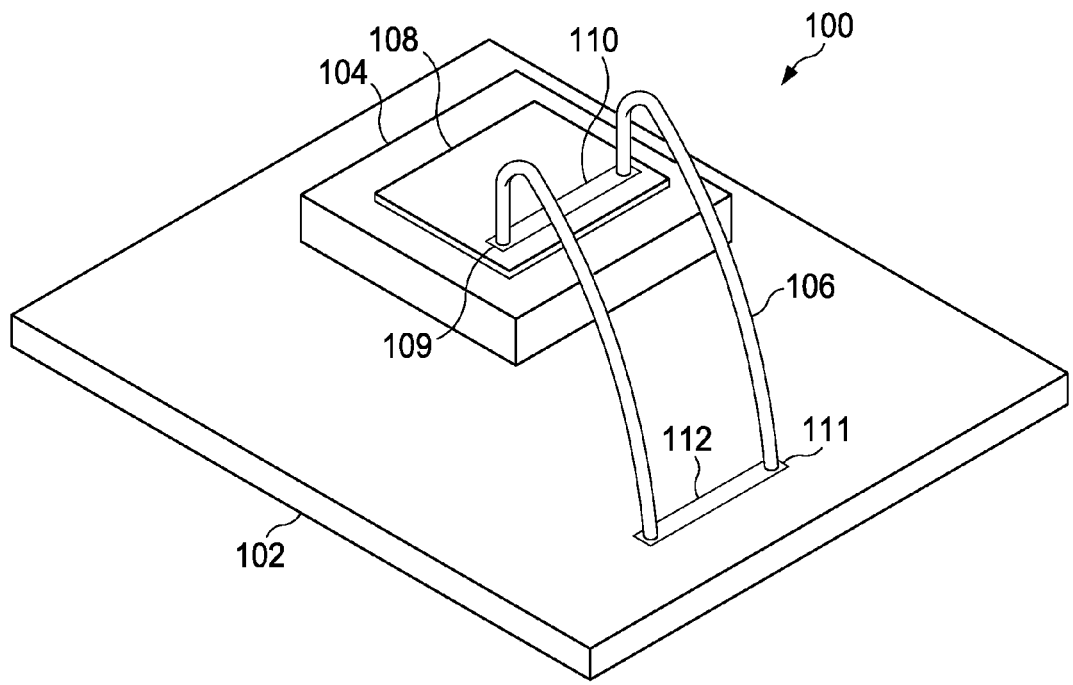
FIG. 1 is a schematic diagram of an exemplary bond wire antenna structure according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary bond wire antenna structure 100 according to some embodiments. The antenna structure 100 includes a substrate 102 that has at least one pad 111 on it for wire bonding. The substrate 102 can be a printed circuit board (PCB), an interposer, a chip, or an integrated circuit substrate, for example.

A chip 104 is mounted on the substrate 102. At least one pad 109 is disposed on the chip 104 for wire bonding. At least one bond wire 106 connects the pad 109 on the chip 104 and the pad 111 on the substrate 102. The bond wire 106 is configured to transmit or receive an electromagnetic wave signal (e.g., radio frequency signal) in at least one specified frequency, e.g., at 10 GHz or 60 GHz, etc. The specified frequency is used for data communication using the electromagnetic wave signal from a data transmitter (or data source) to a data receiver.

The bond wire 106 comprises copper, aluminum, gold, any combination thereof, or any other suitable material. The bond wire 106 has a diameter ranging from 10 µm to 250 µm depending on applications in some embodiments. The length of the bond wire 106 depends on the antenna type/design and the operating frequency. For example, the length of the bond wire 106 can be ½ or ¼ of the wavelength of the radio frequency (RF) signal. If the antenna operates at 60 GHz, the bond wire 106 length can be shorter than at 10 GHz.

The pads 109 and 111 comprise electrically conductive material such as copper, copper alloy, aluminum, aluminum alloy, any combinations thereof, or any other suitable material. The size of the pad 109 and 111 can vary depending on the size of the bond wire 106.

In some embodiments, at least one interconnect 110 is connected to the pad 109 on the chip 104, and, at least one interconnect 112 is connected to the pad 111 on the substrate 102. The interconnects 110 and 112 comprise electrically conductive material such as copper, copper alloy, aluminum, aluminum alloy, any combinations thereof, or any other suitable material.

In some embodiments, a feed line (not shown) for the antenna structure 100 is connected to the pad 109 or interconnect 110 by a via from inside the chip 104. In some other embodiments, the feed line for the antenna structure 100 is connected to the pad 111 or interconnect 112 from the substrate 102. In some embodiments, electrical components (not shown) such as resistor, inductor, switch, transistor, varactor and/or capacitor are connected to the pad 109 or the interconnect 110 to change/control the impedance coupled to the bond wire 106 of the antenna structure 100. For example, an on/off connection switch can be connected between the two pads 109 on the chip instead of the interconnect 110.

A ground plane 108 is disposed on the chip 104 and the ground plane 108 serves as a part of the antenna to reflect electromagnetic wave signal for the antenna structure 100. The ground plane 108 is disposed on the same layer as the pad 109 on the chip 104 in some embodiments and the ground plane 108 is not electrically connected with the pad 109 or the interconnect 110. For example, the ground plane 108 can surround the pad 109 and the interconnect 110 on the chip 104 but separated by a gap in between.

In some other embodiments, the ground plane 108 can be disposed on a different layer from the pad 109 or the interconnect 110 on the chip 104. For example, the ground plane 108 can be formed on a metal layer of the chip 108 below the pad 109 layer and separated/isolated by a dielectric layer such as silicon dioxide or silicon nitride.

The ground plane 108 comprises electrically conductive material such as copper, copper alloy, aluminum, aluminum alloy, any combinations thereof, or any other suitable material. The ground plane 108 can have a square shape with one side length of about 500 µm in some embodiments.

The bond wire antenna structure 100 utilizes the bond wire 106 as a main element for the antenna and provides a packaging solution to implement the antenna. Even though a loop antenna is shown as an embodiment in FIG. 1, many other types of antenna can be implemented using the bond wire 106 and packaging solution shown in FIG. 1. For example, a dipole antenna, a patch antenna, a spiral (planar or helical) antenna, planar inverted F antenna (PIFA), a slot antenna, an antenna array, a folded antenna, or the like can be implemented using the bond wire 106 connecting the pads 109 and 111 of the chip 100 and the substrate 102 respectively.

The bond wire 106 can have a relatively long length for the antenna structure 100 to save the chip 104 area and save the cost to provide a highly integrated solution. In some embodiments, the bond wire antennas structure 100 can be used to communicate with two radio frequency (RF) circuit blocks mounted on one PCB.

Figure 2A:
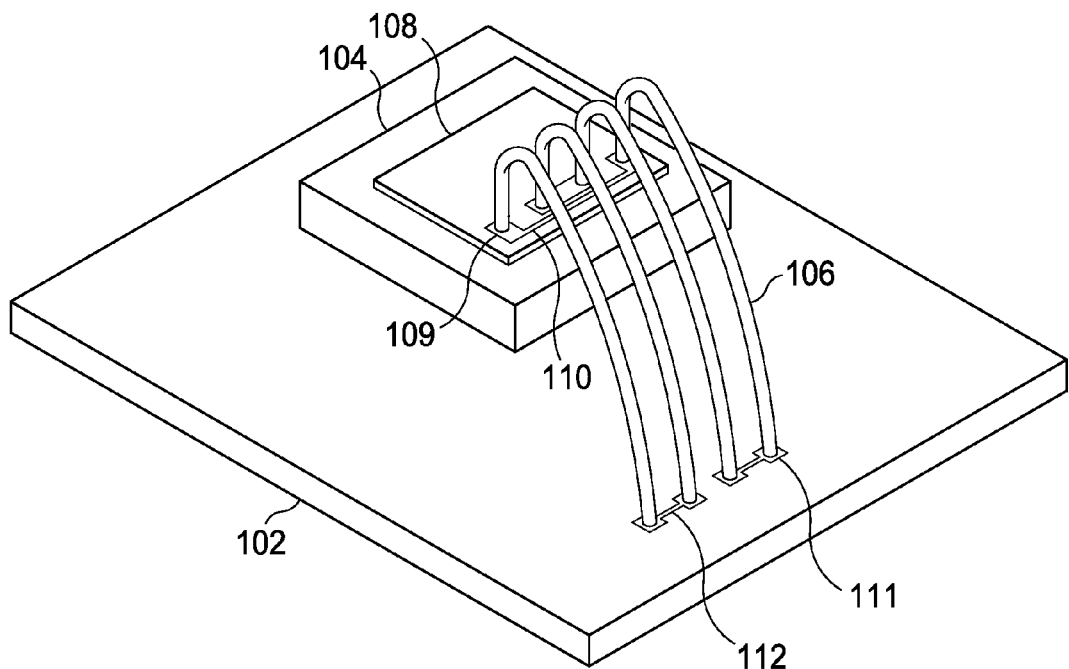
FIGS. 2A-2C are schematic diagrams of other exemplary bond wire antenna structures according to some embodiments.
Figure 2B:
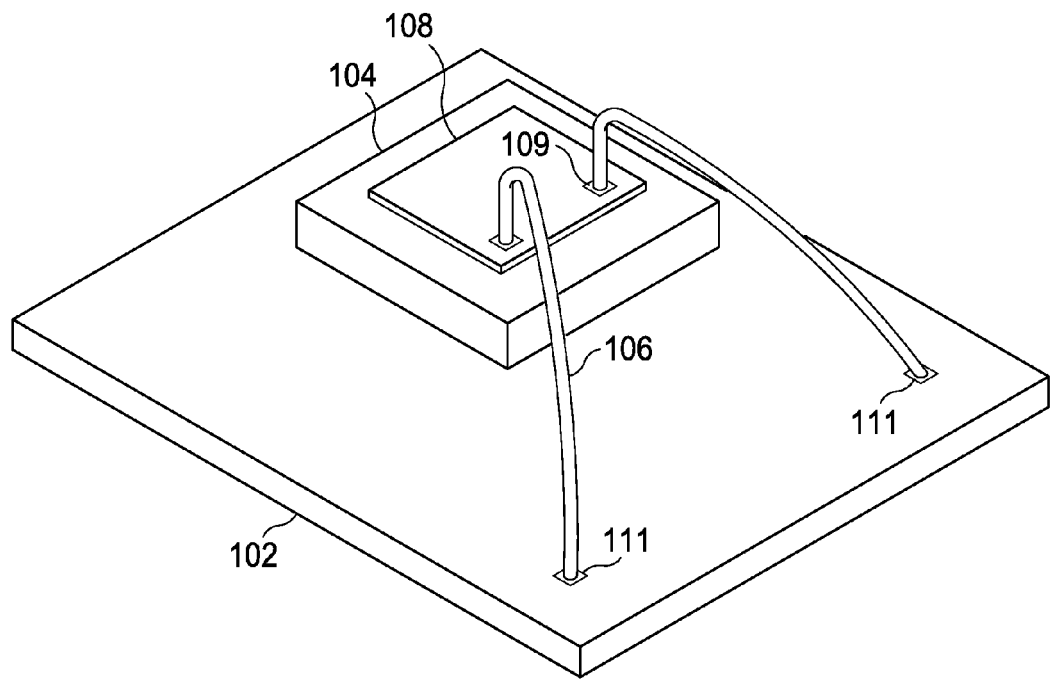
Figure 2C:
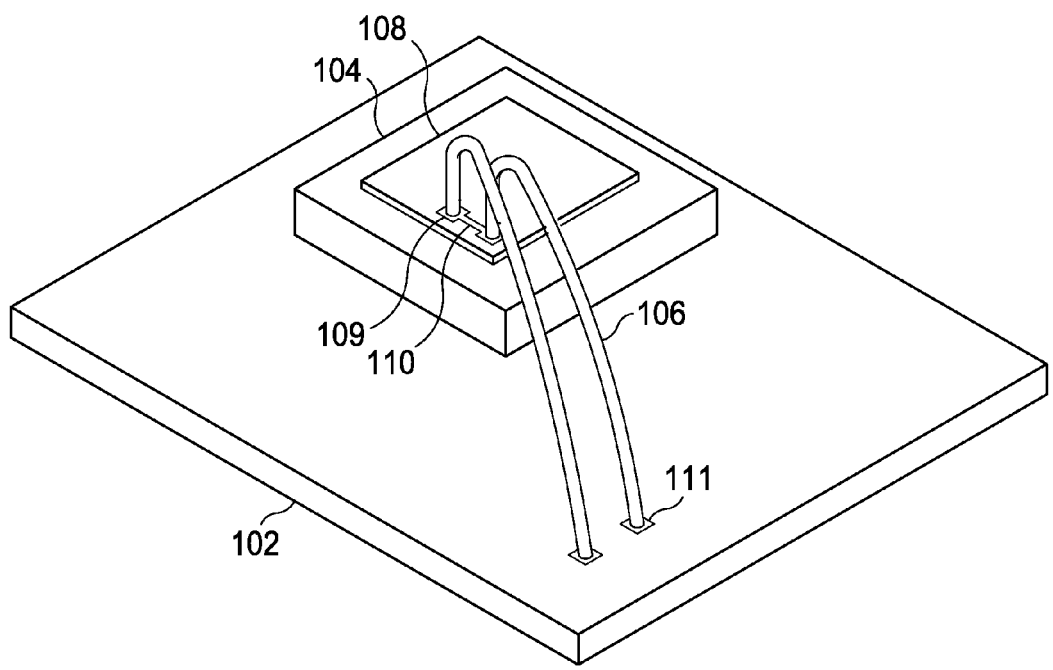

FIGS. 2A-2C are schematic diagrams of other exemplary bond wire antenna structures according to some embodiments. In FIG. 2A, the pads 109 on the chip 104 are connected with interconnects 110 on the chip 104 and the pads 111 on the substrate 102 are connected with interconnects 112 on the substrate 102 to provide many turns in the antenna connection in some embodiments (i.e., from the chip 104 to the substrate 102 and back to the chip 104 and back to the substrate 102, etc.)

In FIG. 2B, the wire bond 106 connects the pads 109 and 111 of the chip 104 and the substrate 102, but there are no interconnects connected to the pad 109 on the chip 104 or the pad 111 on the substrate 102 in some embodiments. In FIG. 2C, there is an interconnect 110 between the pads 109 on the chip 104 but no interconnects connected to the pad 111 on the substrate 102 in some embodiments.

Figure 3A:
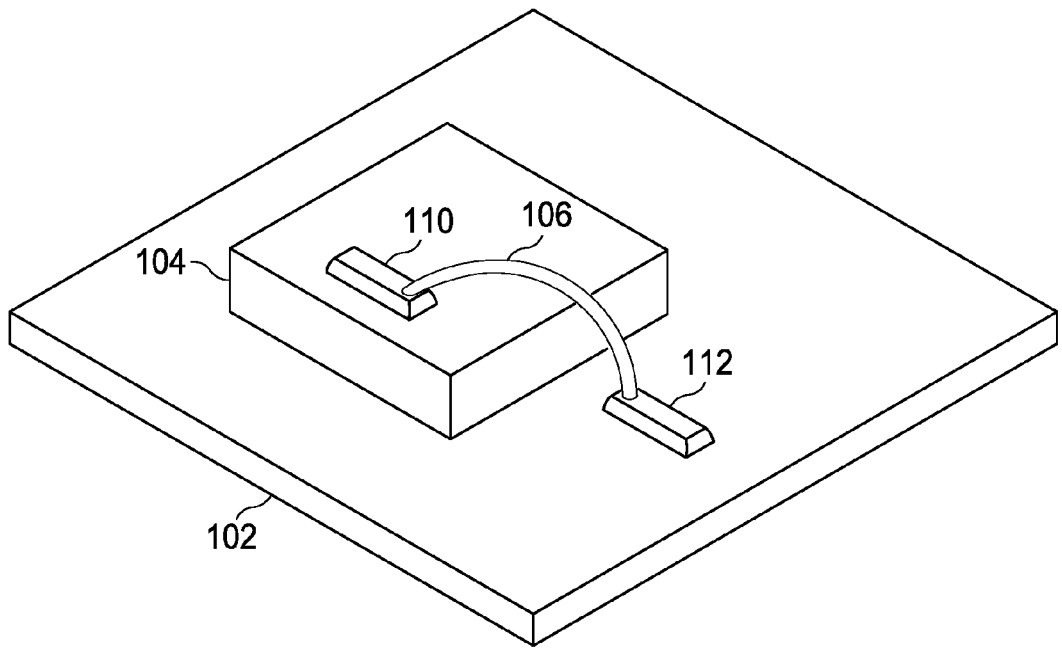
FIGS. 3A-3C are schematic diagrams of other exemplary bond wire antenna structures according to some embodiments.
Figure 3B:
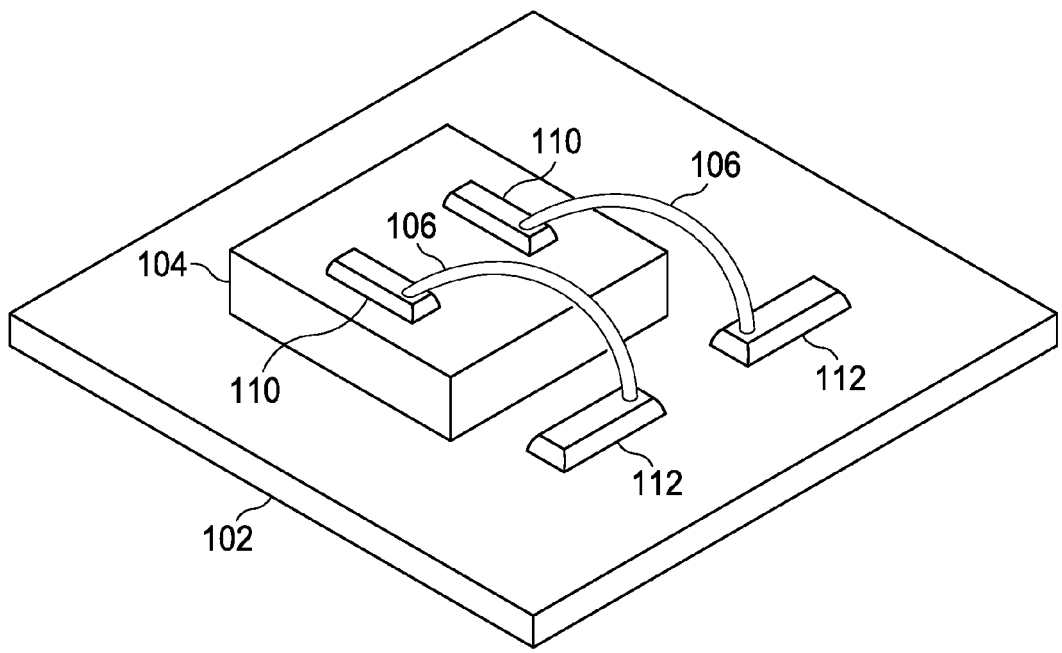
Figure 3C:
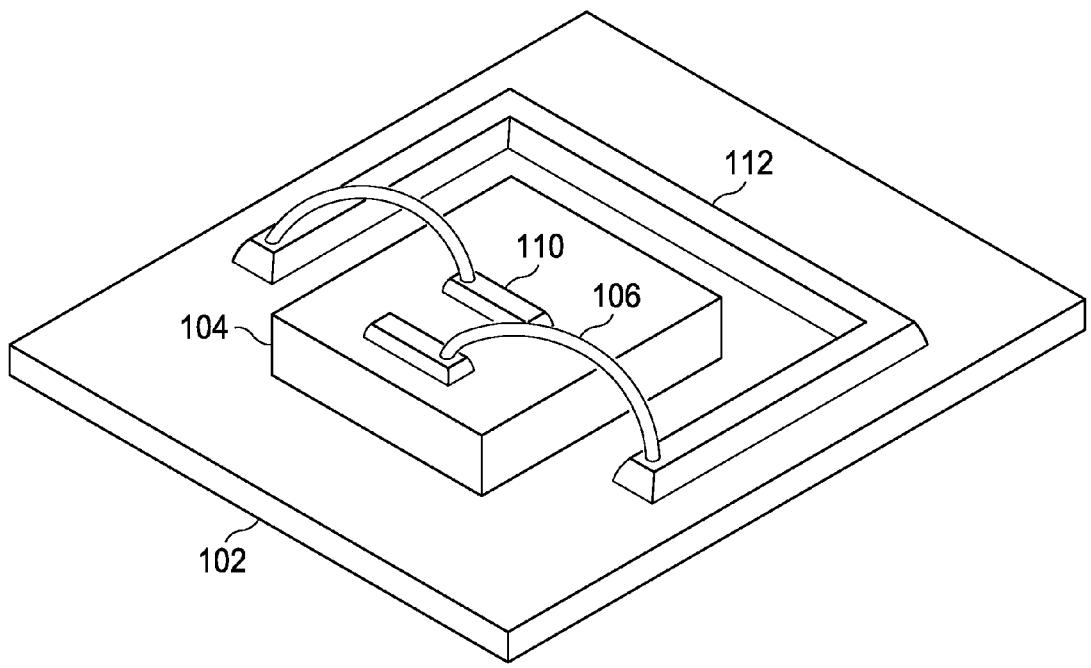

FIGS. 3A-3C are schematic diagrams of other exemplary bond wire antenna structures according to some embodiments. As shown, interconnects 110 and 112 on the chip 104 and the substrate 102 are used as parts of the bond wire antenna structures in FIGS. 3A-3C. The interconnects 110 and 112 comprise electrically conductive material such as copper, copper alloy, aluminum, aluminum alloy, any combinations thereof, or any other suitable material.

In FIG. 3A, the interconnect 110 on the chip 104 and the interconnect 112 on the substrate 102 are connected by the bond wire 106. In FIG. 3B, multiple interconnects 110 on the chip 104 and multiple interconnects 112 on the substrate 102 are connected by multiple bond wires 106.

In FIG. 3C, multiple interconnects 110 on the chip 104 are connected by multiple bond wires 106 to a long surrounding interconnect 112 that is part of an electrical routing on the substrate 102 (e.g., a PCB). In FIG. 3C, the bond wire 106 and the interconnect 112 on the substrate 102 form the main antenna body together. In contrast, for the bond wire antenna structures in FIGS. 2A-2C, the bond wire 106 forms the main antenna body.

Figure 4:
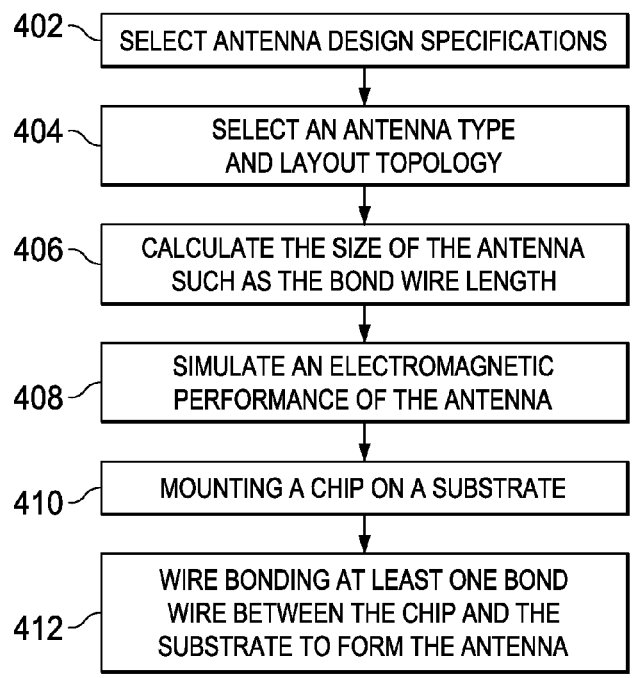
FIG. 4 is a flowchart of a method of fabricating a bond wire antenna in FIG. 1 according to some embodiments.

FIG. 4 is a flowchart of a method of fabricating a bond wire antenna in FIG. 1 according to some embodiments. At step 402, design specifications are selected for an antenna, such as an operating frequency range, bandwidth, gain, directivity, etc. For example, 10 GHz operating frequency can be selected.

At step 404, an antenna type and layout topology is selected for the antenna based on the design specifications and other fabrication considerations such as available chip/PCB area, etc. For example, a loop antenna, a dipole antenna, a patch antenna, a spiral (planar or helical) antenna, planar inverted F antenna (PIFA), a slot antenna, an antenna array, or a folded antenna can be selected depending on applications.

At step 406, the size of the antenna is calculated based on the design specifications such as operating frequency and the antenna type. For example, the total length of bond wire and the interconnect/pad on PCB and on the chip, can be calculated from the operating frequency to be ½ or ¼ of the wavelength of the operating electromagnetic wave signal to reach the best antenna radiation design. (e.g., RF signal).

At step 408, an electromagnetic performance of the antenna is simulated, e.g., using a computer, to verify the selected the antenna type and calculated size compared to the design specifications. The designed antenna performance such as directivity, gain, operating frequency, bandwidth, and any other specifications are evaluated based on the simulation.

At step 410, a chip is mounted on a substrate. The chip has at least one pad for wire bonding and the substrate has at least one pad for wire bonding to implement the bond wire antenna. The pads comprise electrically conductive material such as copper, copper alloy, aluminum, aluminum alloy, any combinations thereof, or any other suitable material. The size of the pad can vary depending on the size of the bond wire to be used for wire bonding.

In some embodiments, a ground plane for the antenna is formed on the chip prior to mounting the chip on the substrate. The ground plane serves as a part of the antenna to reflect electromagnetic wave signal for the antenna structure. The ground plane can have a square shape with one side length of about 500 µm in some embodiments. The ground plane comprises electrically conductive material such as copper, copper alloy, aluminum, aluminum alloy, any combinations thereof, or any other suitable material.

The ground plane can be disposed on the same layer as the pad on the chip and the ground plane is not connected electrically with the pad in some embodiments. For example, the ground plane can surround the pad but separated by a gap in between. In some other embodiments, the ground plane can be disposed on a different layer from the pad. For example, the ground plane can be formed on a metal layer of the chip below the pad layer and separated/isolated by a dielectric layer such as silicon dioxide or silicon nitride.

At step 412, wire bonding is performed for the bond wire between the chip and the substrate to form the antenna. The bond wire comprises copper, aluminum, gold, any combination thereof, or any other suitable material. The bond wire has a diameter ranging from 10 µm to 250 µm depending on applications in some embodiments.

In some embodiments, at least one interconnect can be formed on the chip and/or on the substrate. The interconnects are connected to the pad on the chip or on the substrate in some embodiments as shown in FIGS. 2A-2C. The interconnects can be connected to the bond wire on the chip or on the substrate to form the antenna in some embodiments as shown in FIGS. 3A-3B.

According to some embodiments, an antenna structure includes a substrate having at least one first pad for wire bonding. A chip is mounted on the substrate, and the chip has at least one second pad for wire bonding. At least one bond wire connects the at least one first pad and the at least one second pad. The at least one bond wire is configured to transmit or receive an electromagnetic wave signal in at least one specified frequency for data communication.

According to some embodiments, a method of fabricating an antenna in an integrated circuit package includes mounting a chip on a substrate. At least one bond wire is wire bonded between the chip and the substrate to form the antenna, wherein the at least one bond wire is configured to transmit or receive an electromagnetic wave signal in at least one specified frequency for data communication.

According to yet other embodiments, a method of operating an integrated circuit includes generating a data-containing signal from a signal source, the signal source being coupled to a bond wire bonded between the integrated circuit and a substrate. The method further includes electrically passing the signal from the signal source to the bond wire and transmitting the signal as an electromagnetic wave in at least one specified frequency for data communication from the bond wire.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An antenna structure, comprising:
   a substrate having a first pad for wire bonding;
   a chip mounted on the substrate, the chip having a second pad for wire bonding;
   a ground plane disposed on the chip, the ground plane being on a different layer from the second pad;
   an interconnect disposed in a same layer of the chip as the second pad, the interconnect in contact with the second pad; and
   a bond wire connecting the first pad and the second pad, wherein the bond wire is configured to transmit or receive an electromagnetic wave signal in at least one specified frequency for data communication, wherein the ground plane is configured to reflect the electromagnetic wave signal.

2. The antenna structure of claim 1, further comprising another interconnect disposed in a same layer of the substrate as the first pad, the another interconnect in contact with the first pad.

3. The antenna structure of claim 2, wherein the another interconnect forms a main body of an antenna with the bond wire, wherein the another interconnect and the bond wire are configured to transmit or receive the electromagnetic wave signal.

4. The antenna structure of claim 1, wherein the ground plane is formed in a metal layer isolated from the second pad by a dielectric layer.

5. The antenna structure of claim 1, further comprising at least one electrical component connected to the second pad wherein the at least one electrical component is configured to change an impedance coupled to the bond wire.

6. The antenna structure of claim 1, wherein the bond wire comprises gold, copper, aluminum, or any combination thereof.

7. The antenna structure of claim 1, wherein the first pad and the second pad comprise copper, copper alloy, aluminum, aluminum alloy, or any combination thereof.

8. The antenna structure of claim 1, wherein the bond wire has a diameter ranging from about 10 μm to about 250 μm.

9. The antenna structure of claim 1, wherein the interconnect forms a main body of an antenna with the bond wire, wherein the interconnect and the bond wire are configured to transmit or receive the electromagnetic wave signal.

10. A method of fabricating an antenna in an integrated circuit package, comprising:
    forming a first pad on a first side of a substrate, the first pad contacting a first interconnect on the first side of the substrate, wherein the first pad and the first interconnect are formed in a first layer of the substrate;
    forming a second pad on a first side of a chip, the second pad contacting a second interconnect on the first side of the chip, wherein the second pad and the second interconnect are formed in a second layer of the chip;
    forming a third pad in the first layer of the substrate, the third pad contacting a third interconnect disposed in the first layer of the substrate;
    forming a fourth pad in the second layer of the chip, the fourth pad contacting a fourth interconnect disposed in the second layer of the chip;
    mounting the chip on the substrate; and
    wire bonding a first bond wire between the second pad of the chip and the first pad of the substrate to form at least a part of the antenna, wire bonding a second bond wire between the fourth pad of the chip and the third pad of the substrate to form another part of the antenna, wherein at least the first bond wire is configured to transmit or receive an electromagnetic wave signal in at least one specified frequency for data communication.

11. The method of claim 10, further comprising forming a ground plane on the chip.

12. The method of claim 10, further comprising:
    selecting a specification for the antenna;
    selecting an antenna type;
    calculating a total length of bond wire; and
    simulating an electromagnetic performance of the antenna.

13. The method of claim 10, wherein the first and the third pads form a first group of pads, wherein the second and the fourth pads form a second group of pads, and wherein at least one of the first and the second groups of pads are connected together by one of the first and the second interconnects.

14. The method of claim 10, wherein the first and the third interconnects are connected together and form a continuous structure along a perimeter of the chip, wherein the continuous structure, the first bond wire, and the second bond wire form a main body of the antenna and are configured to transmit or receive the electromagnetic wave signal.

15. An integrated circuit package including an antenna, the antenna comprising:
    at least one first pad for wire bonding in an upper layer of a substrate;
    at least one interconnect in the upper layer of the substrate and contacting the at least one first pad;
    at least one second pad for wire bonding disposed on a chip, wherein the chip is mounted on the substrate;
    at least one bond wire connecting the at least one first pad and the at least one second pad; and
    a ground plane disposed on the chip,
    wherein the at least one bond wire and the at least one interconnect are configured to transmit or receive an electromagnetic wave signal in at least one specified frequency for data communication, wherein the ground plane is formed in a metal layer of the chip and isolated from the second pad by a dielectric layer, and wherein the ground plane is configured to reflect the electromagnetic wave signal.

16. The integrated circuit package of claim 15, wherein a diameter of the at least one bond wire is between about 10 µm to about 250 µm.

17. The integrated circuit package of claim 15, wherein a length of the at least one bond wire is about ½ or ¼ of a wavelength of the electromagnetic wave signal.

18. A method of operating an integrated circuit comprising:
generating a data-containing electrical signal from a signal source;
electrically passing the data-containing electrical signal to a bond wire bonded between a second pad in an upper layer of the integrated circuit and a first pad in an upper layer of a substrate;
transmitting the data-containing signal from the bond wire and a first interconnect as an electromagnetic wave in at least one specified frequency for data communication, the first interconnect disposed in the upper layer of the substrate and in contact with the first pad; and
reflecting the electromagnetic wave using a ground plane of the integrated circuit, the ground plane disposed on a different layer from the second pad.

19. The method of claim 18 further comprising:
receiving at the bond wire a second electromagnetic wave;
converting the second electromagnetic wave into a second data-containing electrical signal; and
passing the second data-containing electrical signal to a device in the integrated circuit.

20. The method of claim 18, further comprising attaching the integrated circuit on the substrate.

21. The method of claim 18, further comprising:
forming a third pad in the upper layer of the substrate, wherein the third pad contacts a third interconnect disposed in the upper layer of the substrate;
forming a fourth pad in the upper layer of the integrated circuit, wherein the second pad and the fourth pad contact a second interconnect and a fourth interconnect, respectively, and wherein the second interconnect and the fourth interconnect are disposed in the upper layer of the integrated circuit; and
bonding another bond wire between the third pad and the fourth pad.

22. The method of claim 21, further comprising transmitting the date-containing signal from the another bond wire and the third interconnect as the electromagnetic wave.

* * * * *